United States Patent [19]

Kurosaka et al.

[11] Patent Number: 5,366,583
[45] Date of Patent: Nov. 22, 1994

[54] PROCESS FOR PREPARING BARIUM TITANATE SINGLE CRYSTALS

[75] Inventors: Akihito Kurosaka, Toda; Kazuhiko Tomomatu, Tokyo; Osamu Nakao, Tokyo; Shoji Ajimura, Tokyo; Haruo Tominaga, Sakura, all of Japan

[73] Assignee: Fujikura Ltd., Tokyo, Japan

[21] Appl. No.: 957,902

[22] Filed: Oct. 8, 1992

[30] Foreign Application Priority Data

Oct. 8, 1991 [JP] Japan .................................. 3-289076
Apr. 28, 1992 [JP] Japan .................................. 4-108235

[51] Int. Cl.$^5$ ........................................... C30B 29/32
[52] U.S. Cl. ........................................... 117/3; 117/80; 117/949
[58] Field of Search .................. 156/605, 617.1, 619.1, 156/620.2, DIG. 73, DIG. 75, DIG. 78

[56] References Cited

U.S. PATENT DOCUMENTS 3,420,776  1/1969  Hepplewhite et al. .
4,724,038  2/1988  Pastor et al. ...................... 156/620.2

FOREIGN PATENT DOCUMENTS 1157500  6/1989  Japan .
2145498  6/1990  Japan ........................... 156/DIG. 75
3275585  12/1991  Japan ........................... 156/617.1
4300297  10/1992  Japan ........................... 156/620.2
8707655  12/1987  WIPO .

OTHER PUBLICATIONS

J. P. Remeika, A Method For Growing Barium Titanate Single Crystals, J. Am. Chem. Soc., vol. No. 76 (1954), pp. 940-941.
P. G. Schunemann et al., Effects Of Feed Material And Annealing Atmosphere On The Properties Of Photorefractive Barium Titanate Crystals, J. Opt. Soc. Am. B., vol. No. 5, Aug. (1988), pp. 1702-1710.
D. Rytz et al., Photorefractive Properties Of BaTiO$_3$:Co, J. Opt. Soc. Am. B., vol. No. 7 Dec. (1990), pp. 2245-2254.
D. E. Rase and R. Roy; Phase Equilibria In The System BaO-TiO$_2$, J. Am. Ceram., vol. 38, (1955), pp. 102-113.
Kitayama, Japan Society of Applied Physics, Crystal Engineering Section, the test for the 95th Study Meeting (1991), pp. 13-17.
Hlasivcova et al., "A Contribution to the Determination of the Deviation from the Oxygen Stoichiometry of Barium Titanate Single Crystals", Kristall Und Technik, vol. 6, No. 1, 1971, Berlin DD, pp. K11-K15, month unknown.

Primary Examiner—Robert Kunemund
Attorney, Agent, or Firm—Cushman, Darby & Cushman

[57] ABSTRACT

A mixture of titanium dioxide and an oxide or carbonate of barium includes one or more transition metal elements selected from the group of V, Cr, Mn, Fe, Co, Ni and Cu, in the amount of 2 ppm or more. This mixture is used as a starting material. The mixture is heated to a predetermined temperature to make a melt. Then, a seed crystal of BaTiO$_3$ is brought into contact with the melt under an environment with a low oxygen partial pressure of 0.02 atm. or less. From this state, the above melt is slowly cooled to grow a single crystal on the seed crystal. The thus obtained single crystal is heated in a temperature of 600° C. or more, under an oxidizing environment with its oxygen partial pressure more than 0.1 atm.

8 Claims, 3 Drawing Sheets

PROCESS FOR PREPARING BARIUM TITANATE SINGLE CRYSTALS

BACKGROUND OF THE INVENTION

1. Field of the Invention

The present invention relates to a process for preparing barium titanate ($BaTiO_3$) single crystals which exhibit high photorefractive properties and can be applied to optical-devices such as phase-conjugate mirrors, laser resonators, optical image-processing, etc.

2. Description of Related Art

Known methods of preparing single crystals of $BaTiO_3$ include the flux method in which potassium fluoride (KF), barium chloride ($BaCl_2$) or the like is used as a flux material (J. P. Remeika et al., J. Am. chem Soc., vol. No.76, p.p. 940–41, (1954)). The single crystal of $BaTiO_3$ prepared in this method is called a butterfly type crystal, which will have triangle shapes of about 1 mm in maximum thickness. With this method, it is impossible to produce single crystals of $BaTiO_3$ which are large enough and thick enough to be applied to optical devices.

After the flux method, the Top Seeded Solution Growth technique (T.S.S.G technique) for preparing single crystals of $BaTiO_3$ was developed. In this method, the crystals of $BaTiO_3$ are grown on seed crystal ($BaTiO_3$ single crystal), while a melt containing titanium dioxide ($TiO_2$) in excess of $BaTiO_3$ composition is gradually cooled.

This method allows the single crystals of $BaTiO_3$ to form a desired bulk shape, and to be less contaminated by the flux and other impurities. Therefore, the single crystals of $BaTiO_3$ prepared by this method are excellent in optical characteristics compared to those prepared by the flux method. For this reason, studies for applying $BaTiO_3$ single crystals to optical devices as photorefractive crystals have developed actively (see. Kitayama, Japan Society of Applied Physics, Crystal Engineering Section, the text for the 95th Study Meeting, p.p. 13–17 (1991)).

Recently, a more improved form of $BaTiO_3$ single crystal in its photorefractive properties has been demanded by the technologies which need to use photorefractive crystals of this kind. Furthermore, it is now believed that the photorefractive properties of the $BaTiO_3$ single crystal is dependent upon crystal defects such as oxygen vacancies or the presence of impurities e.g. transition metal elements etc. in the single crystal.

For this reason, in order to enhance the photorefractive properties of $BaTiO_3$ single crystals the method has ben proposed in which single crystals of $BaTiO_3$ grown in the air are heated in an atmosphere having a low partial pressure of oxygen or in a reducing atmosphere (P. G. Schunemann et al, J. Opt. Soc. Am. B., Vol. No.5, p.p. 1702-10 (1988)). Another method for enhancing the photorefractive properties has been proposed in which transition metal elements such as Fe and Cr, etc. are doped into single crystals of $BaTiO_3$ (D. Rytz et al., J. Opt. Soc. Am. B., Vol. No.7, p.p. 2245-54, (1990)). Furthermore, another method has been disclosed in which a mixture of substances, including $BaTiO_3$ single crystals, is melted, and thereafter the mixture is placed in a $CO/CO_2$ atmosphere in order to grow a single crystal of $BaTiO_3$ (U.S. Pat. No. 4,724,038).

It has also been found that oxygen vacancies in the $BaTiO_3$ single crystal grown in air can be increased much more by heating in an atmosphere having a lower partial pressure of oxygen or a reducing atmosphere. It is also possible to increase the content of transition metal elements in the single crystal by doping impurities such as Fe, Cr and the like into the $BaTiO_3$ single crystal, to thereby enhance the photorefractive properties. Furthermore, a single crystal of $BaTiO_3$ which has an increased number of oxygen vacancies can be obtained by growing the single crystal in a reducing atmosphere containing CO gas. Thus the single crystals of $BaTiO_3$ prepared in these methods exhibit relatively great photorefractive properties.

The photorefractive properties of the $BaTiO_3$ single crystals prepared by the methods reported up to date are, however, still insufficient for practical use. There are still many uncertain factors in the relationship between the photorefractive properties of $BaTiO_3$ single crystals produced and the effects of the amount of doping transition metal elements or the amount of heating in a reducing atmosphere mentioned above. In conclusion, it is difficult based on what is conventionally known to stably prepare or provide $BaTiO_3$ crystals exhibiting good photorefractive properties.

SUMMARY OF THE INVENTION

It is therefore an object of the present invention to provide a method for preparing barium titanate single crystals which can stably provide single crystals of $BaTiO_3$ exhibiting excellent photorefractive properties.

The process for preparing a single crystal of barium titanate according to the present invention comprises the steps of: a) melting a starting material mixture of titanium dioxide and an oxide or carbonate of barium to obtain a melt; b) growing a single crystal on the surface of a seed crystal of $BaTiO_3$ by bringing the seed crystal into contact with the melt obtained in the heating step in a closed atmosphere comprising an inert gas and oxygen and having an oxygen partial pressure of 0.02 atm. or less and thereafter slowly cooling the melt; and c) heating the single crystal in a closed atmosphere comprising an inert gas and oxygen and having a higher oxygen partial pressure than in the growing step.

According to the present invention, the single crystal is grown in a closed atmosphere comprising an inert gas and oxygen and having an oxygen partial pressure of 0.02 atm or less, and the single crystal obtained in the growing step is then heated in a closed atmosphere comprising an inert gas and oxygen and having a higher oxygen partial pressure than the atmosphere of the growing step. This allows preparation of $BaTiO_3$ single crystals having very good hole-dominant photorefractive properties.

DESCRIPTION OF THE PREFERRED EMBODIMENTS

Figure 1:
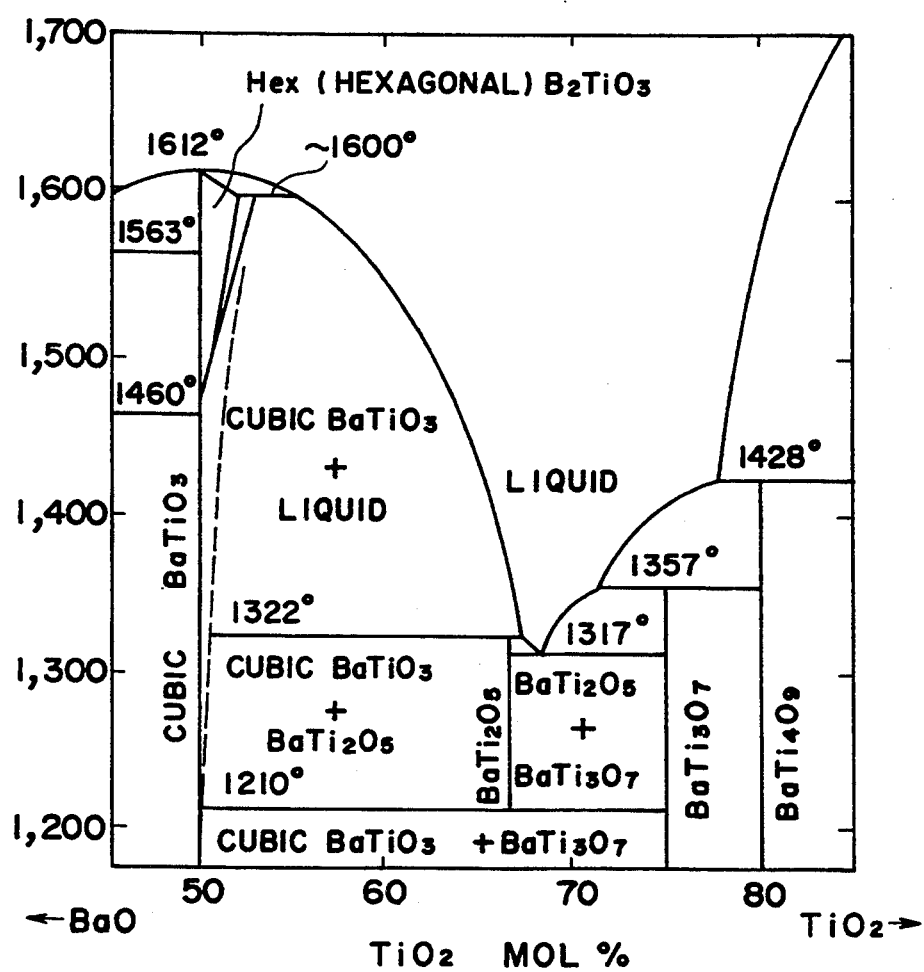
FIG.1 is an equilibrium state diagram of a $BaO-TiO_2$ system.

The present inventors have achieved development of $BaTiO_3$ single crystals showing excellent photorefractive properties.

This development was based on several observations made by the present inventors in their studies of BaTiO$_3$ single crystals and methods of making such crystals. These observations include the following;

(1) The photorefractive properties of BaTiO$_3$ single crystals are mainly due to the presence of photo-carriers composed of holes and electrons.

(2) One of the primary ways to enhance the photorefractive properties of BaTiO$_3$ single crystals is to increase the photo-carrier density in the single crystal.

(3) In the case where the photorefractive properties of BaTiO$_3$ single crystals are hole-dominant(e.g. the photorefractive properties being predominantly achieved by the holes in the photo-carriers, the ratio of hole to electron in the photo-carriers must be increased in order to further enhance the photorefractive properties. On the other hand, where the photorefractive properties of BaTiO$_3$ are electron-dominant (e,q.the electrons in the photocarriers being dominant in their effect on the photorefractive properties, the ratio of hole to electron must be decreased in order to improve photorefractive properties.

(4) The holes or electrons constituting photocarriers are formed by crystal defects such as oxygen vacancies, etc. in the single BaTiO$_3$ crystal. Therefore, in order to increase the number of crystal defects and thereby heighten the photocarrier density, it is more effective to grow a crystal in a low oxygen partial pressure, since the effect of the low oxygen partial pressure is to make more oxygen vacancies in oxides.

(5) After the completion of the growth of the crystal in the growing step, heating the crystal under an atmosphere having a different partial pressure of oxygen from the growing step may possibly cause oxidizing or reducing reactions in the single crystal of BaTiO$_3$ (e.g., variation in valency of transition metal elements contained as impurities takes place such that element M changes into $M^{n+}$, $M^{(m-1)+}$, or etc). The reactions function effectively to change the ratio of hole to electron in the photo-carriers, thus enhancing the photorefractive properties.

On the basis of the above concepts, BaTiO$_3$ single crystals were grown from a melt comprised of titanium dioxide (TiO$_2$) and of barium oxide (such as BaO) or of barium carbonate (such as BaCO$_3$), under an atmosphere in which oxygen partial pressure is lower than that in the air, specifically at 0.02 atm. or less. As a result, the present inventors found that the single crystals grown in an atmosphere having such a low oxygen partial pressure (without being heated in a heating step) exhibit stronger photorefractive properties than a single crystal grown in the air (without being heated in a heating step). In addition to this, they found that in the single crystals prepared by this method, the photorefractive properties are hole-dominant. In this case, it was also found that if the single crystal grown under a low oxygen partial pressure is heated in the heating step under a higher oxygen partial pressure than that of the oxygen partial pressure of the growing step, the hole-dominant photorefractive properties are still more increased after the heat treatment. Thus, the present invention has been achieved, by among other things, setting up proper conditions of atmosphere, temperature, etc. for crystal growth and heat treatment.

The present inventors have found that when the BaTiO$_3$ single crystals are grown in an oxygen partial pressure of higher than 0.023 atm., the photorefractive properties exhibited by the single crystals were no better than single crystals grown conventionally in an air atmosphere. For this reason, it is necessary to set the oxygen partial pressure in the growing step at 0.02 atm. or less.

Furthermore, the present inventors have found that the BaTiO$_3$ single crystal which was grown in an oxygen partial pressure of 0.02 atm. or less without undergoing a further heating step exhibits hole-dominant photorefractive properties. On the other hand, when this BaTiO$_3$ single crystal obtained from the growing step is heated under an oxygen partial pressure higher than that in the growing step, oxidizing reactions take place ($M^{(n-1)+} \rightarrow M^{n+}$), in which impurity transition metal elements included in the single crystal of BaTiO$_3$ are oxidized. Accordingly, the single crystal of BaTiO$_3$ which has been heated under the higher oxygen partial pressure than that in the growth step has an increased ratio of hole to electron compared to a single crystal which has not undergone the heating step. Thus, the hole-dominant photorefractive properties are increased as a result of the heating step.

On the other hand, the BaTiO$_3$ crystal which underwent a heating step at the same oxygen partial pressure as that in the growing step exhibited photorefractive properties equal to but not greater than the level of the crystal which did not undergo a heating step. Furthermore, the single crystal of BaTiO$_3$ subjected to a heating step under a lower oxygen partial pressure than that in the growth step exhibited decreased photorefractive properties compared to the crystal which did not undergo a heating step.

The present inventors have observed that the heating temperature in the heating step following the crystal growing step is required to be at a level so as to accelerate oxidizing reactions of the impurity transition metals included in the BaTiO$_3$ single crystal obtained from the growing step. Heating the single crystal at an elevated temperature accelerates the oxidizing reactions in a short period of time, but the single crystal is likely to develop cracks or other defects in the cooling process after the heating step. On the other hand, heating the crystal at a lower temperature decreases the probability of the occurrence of cracks or other defects in the cooling process, but a prolonged heating time is needed to accelerate the oxidizing reactions. As a result of these observations, the present inventors have found that a preferred heating temperature falls within a range of 600° to 1250° C. with a preferred heating time of 1 to 24 hours.

As discussed above, transition metal elements are important to obtain crystal defects in the single crystals during the growing step and for the oxidizing and reducing reactions during the heating step. That is, transition metals have a great influence upon the photorefractive properties of BaTiO$_3$ single crystals. Accordingly, single crystals of BaTiO$_3$ preferably include at least a certain minimum level of the transition metal elements, in order to improve the photorefractive properties.

When a single crystal of BaTiO$_3$ is prepared by the method of the present invention from a melt in which the melting step is conducted in the presence of transition metal elements or the transition metal elements have been added to the starting melt to achieve 2 ppm or more of the transition metals in the melt, the obtained single crystal of BaTiO$_3$ exhibits increased photorefractive properties.

Examples of the present invention are described in detail below. According to the present invention, at first a mixture of titanium dioxide and an oxide or carbonate of barium is prepared as a starting material. Then the mixture is melted by being heated to 1330° C. or more to make a melt. As shown in FIG. 1, a phase equilibrium state diagram of BaO—TiO$_2$ system (D. E. Rase and R. Roy; J.Am. Ceram., Vol. 38, p.p. 101–13, (1955)), a temperature of 1330° C. or more is required to obtain a stable melt. In a more preferred embodiment, the melting temperature is in a range of from 1300° to 1600° C. In a most preferred embodiment, the melting temperature is in a range of from 1300° to 1460° C.

If a melt has a composition ratio of TiO$_2$ : BaO = 1:1, crystals of a hexagonal system will be grown. However, crystals of a cubic system are preferred. Therefore, in a preferred embodiment of the present invention, the melt contains an excess of TiO$_2$ in order to produce crystals of a cubic system. After the melt is formed, a seed crystal of BaTiO$_3$ is brought into contact with the melt. Thereafter, the melt is slowly cooled to grow single crystals on the interface of the seed/melt.

An apparatus is described below for growing the BaTiO$_3$ single crystals.

Figure 2:
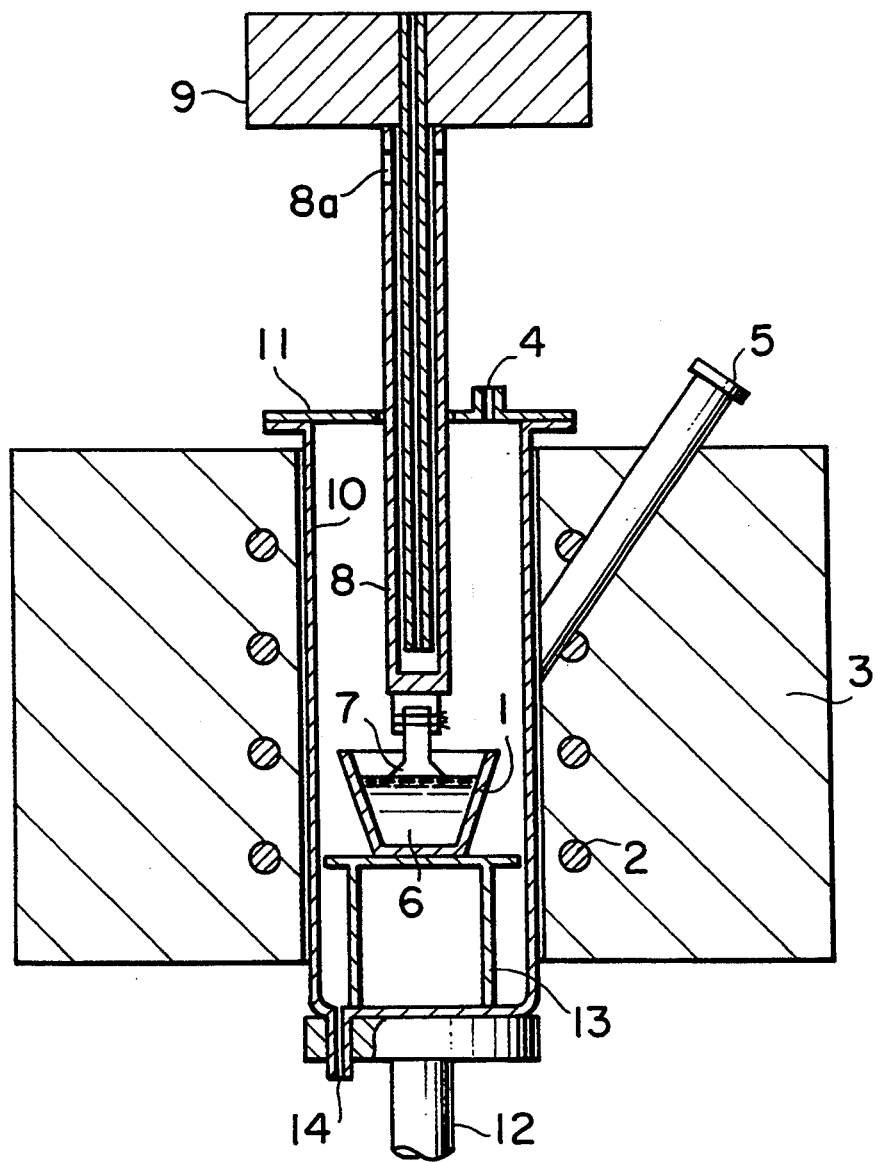
FIG.2 is a sectional view showing an apparatus for growing a single crystal used in an embodiment of the present invention.

FIG. 2 shows a sectional view of the growing apparatus. Heat insulator 3 has a heating space hollowed out vertically from the center of the upper face to the lower face thereof. Heater 2 is buried in heat insulator 3 so that heater 2 can surround the heating spaces. In addition, heat insulator 3 has observation window 5 positioned at a proper peripheral position on the upper face in order to reach an approximately middle height of the above heating space. The growth of single crystals can be observed through window 5.

Pedestal 12 is provided around the bottom end of the heating space of heat insulator 3. Muffle 10 is arranged on pedestal 12 such that it passes through the heating space of heat insulator 3. Muffle 10 is a bottomed cylinder made of silica glass, etc., and is sealed on the upper end thereof by lid 11 made of silica glass, etc. A gas blow inlet 4 is positioned in a peripheral portion of lid 11. A gas exit 14 is provided on the bottom of muffle 10 and is controlled through gas blow inlet 4 and gas exit 14.

Arranged inside muffle 10 is crucible-stand 13, on which crucible 1 for storing starting melt 6 is mounted. At the center of lid 11 is provided a hole through which seed rod 8 is inserted. The lower half portion of seed rod 8 is inserted into muffle 10 through the hole on lid 11, the lower end of which is in a position just above crucible 1 inside muffle 10. Seed rod 8 is formed by a double tube comprising an inner tube and an outer tube, and has the upper end thereof fixed to raising and lowering head 9. A cooling gas is supplied from the external system into the inner tube of seed rod 8, and passes through the inner tube to reach a bottom space defined by the outer tube and the inner tube. Then the gas flows through the space upward to be exhausted from the outlet 8a disposed in the upper portion of the outer tube. In this manner seed rod 8 is cooled.

Raising and lowering head 9 is driven up and down by means of a driving unit (not shown), and in accordance with the up-down movement of head 9, seed rod 8 is raised or lowered. Seed rod 8 has a seed crystal attachment portion at the bottom end thereof, and seed crystal 7 is made to be attached to the attachment portion.

In the growing apparatus thus constructed, single crystals of BaTiO$_3$ were prepared according to examples and comparative examples of the present invention.

The characteristics of the crystals are detailed below in the examples and comparative examples. The contents of transition metal elements in the melt of the starting material are shown in Table 1 below for each of the examples and comparative examples. These contents were measured by cooling a sample of each melt to room temperature and subjecting the cooled melt to mass-spectrometry. In Table 1, ND denotes the case when the content of the corresponding element is lower than the detection limit.

TABLE 1

| | | Content of Transition Metal Element (ppm) | | | | | | | |
|---|---|---|---|---|---|---|---|---|---|
| | | V | Mn | Cr | Fe | Co | Ni | Cu | total |
| Example | 1 | ND | ND | 2 | 5 | 3 | 1 | ND | 11 |
| | 2 | ND | ND | ND | ND | 1 | 1 | ND | 2 |
| | 3 | ND | ND | 2 | 5 | 3 | 1 | ND | 11 |
| | 4 | ND | ND | 2 | 5 | 3 | 1 | ND | 11 |
| | 5 | ND | ND | 2 | 5 | 3 | 1 | ND | 11 |
| Comparative Example | 1 | ND | ND | ND | ND | 1 | 1 | ND | 2 |
| | 2 | ND | ND | 2 | 5 | 3 | 1 | ND | 11 |
| | 3 | ND | ND | 2 | 5 | 3 | 1 | ND | 11 |
| | 4 | ND | ND | 2 | 5 | 3 | 1 | ND | 11 |

Explanation will be made below as to experimental conditions of each of the examples and comparative examples.

EXAMPLE 1

A TiO$_2$ powder and a BaCO$_3$ powder were mixed in a molar ratio of 65:35. The mixture had a transition metal element content shown in the column of Example 1 in Table 1. The mixture was charged in crucible 1, which in turn was set inside muffle 10. Then the mixture was heated by means of heater 2 to make a melt. Thus starting melt 6 was obtained. Starting melt 6 was heated to 1400° C. by means of heater 2 and was kept at that temperature until it was brought into contact with seed crystal 7.

Seed crystal 7 of barium titanate (BaTiO$_3$) was attached to the bottom end of seed rod 8. Seed crystal 7 was brought into contact with melt 6 by lowering head 9. The temperature of melt 6 was lowered at a rate of 5° C./hour. At the time when crystallization on the surface of seed crystal 7 was observed, the lowering rate of the temperature of melt 6 was changed to 0.3° C./hour, and seed rod 8 was pulled away from melt 6 at a rate of 0.4 mm/hour.

During the crystal growth, argon gas was supplied into muffle 10 through gas blow inlet 4, whereas the collected gas from gas exit 14 was sampled to measure the oxygen partial pressure (P$_{o2}$) using a zirconia limiting current type oxygen analyzer. The measured result, i.e. the oxygen partial pressure of the crystal-growing atmosphere was 0.01 atm. The crystal obtained from the growing step was heated at 1200° C. for 24 hours in the air.

The thus heat-treated single crystal of BaTiO$_3$ was cut along the (100) plane and (001) plane to form a hexahedron and all the faces were mirror-polished. Then the crystal was subjected to mechanical and electrical poling to remove the domains in the crystal, thus obtaining a 3.5 mm cubic BaTiO$_3$ single crystal with a side of 3.5 mm.

EXAMPLE 2

A BaTiO$_3$ single crystal was prepared in the same manner as Example 1 except that the composition of the starting mixture contained transition metal elements in a total amount of 2 ppm as shown in Table 1.

EXAMPLE 3

A BaTiO3 single crystal was prepared in the same manner and with the same starting material as Example 1 except that the oxygen partial pressure in the growing step was increased to 0.02 atm.

EXAMPLE 4

A BaTiO3 single crystal was prepared in the same manner as Example 1 except that in the heat-treatment step, the crystal resulting from the growing step was heated in a gas mixture of argon and oxygen and the oxygen partial pressure was regulated at 0.1 atm.

EXAMPLE 5

A BaTiO3 single crystal was prepared in the same manner as Example 1 except that in the heating step, the crystal resulting from the growing step was heated at 600° C.

COMPARATIVE EXAMPLE 1

A BaTiO3 single crystal was prepared in the same manner as Example 2 except that the crystal was grown in an air atmosphere.

COMPARATIVE EXAMPLE 2

A BaTiO3 single crystal was prepared in the same manner as Example 1 except that the crystal was grown in an air atmosphere.

COMPARATIVE EXAMPLE 3

A BaTiO3 single crystal was prepared in the same manner as Example 1 except that the oxygen partial pressure in the growing step was increased to 0.1 atm.

COMPARATIVE EXAMPLE 4

A BaTiO3 single crystal was prepared in the same manner as Example 4 except that the oxygen partial pressure in the heating step was decreased to 0.01 atm.

Figure 3:
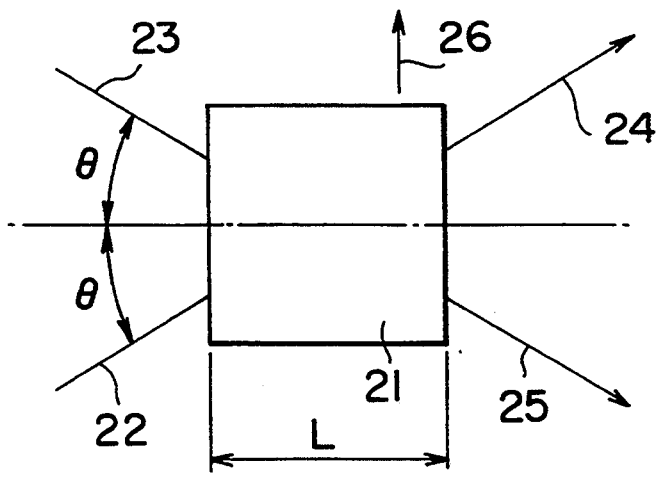
FIG.3 is a schematic diagram showing an experiment in which two laser beams are coupled by simultaneously beaming them onto a $BaTiO_3$ single crystal.

Photorefractive properties of single crystals of BaTiO3 for each of the examples and comparative examples were measured by steady-state beam coupling, which will be explained hereinafter. FIG. 3 is a schematic diagram showing the coupling experiment with the two laser beams.

Barium titanate single crystal 21 having a length of L is arranged with its polarization direction oriented in the direction of arrow 26. Two coherent laser beams 22 and 23 having a wavelength of 514.5 nm are each incident onto a BaTiO3 single crystal 21, making an angle of $\theta$ with respect to the direction perpendicular to the polarization direction of the crystal. The resulting laser beams 24 and 25 are transmitted from BaTiO3 single crystal 21. The intensity of laser beam 23 is, for example, about 100 times that of laser beam 22.

In this arrangement, two kinds of measurements on the intensity of laser beam 24 were made. First of all, the intensity $I_{24}$ of laser beam 24 was measured, $I_{24}$ being the intensity of laser beam 24 when laser beam 23 was being irradiated onto the crystal Secondly, intensity $I'_{24}$ was measured, $I'_{24}$ being the intensity of laser beam 24 when irradiation of the crystal by laser beam 23 was stopped. Using the result of these measurements as well as the length L of single crystal 21, the gain coefficient $\Gamma$ defined in the following formula (natural logarithms) was determined.

$$\Gamma = \ln(I_{24}/I'_{24})/L$$

Each measurement was made with the beam incident angle $\theta$ of laser beams 22 and 23 being fixed at 31°, and the grating period $\Lambda g$ being 0.5 $\mu m$ ($\Lambda g = \lambda/2\sin\theta = 514.5$ nm/2sin31°). The resulting gain coefficient was calculated for each of the examples and comparative examples. It can be said that the larger the gain coefficient $\Gamma$ is, the greater photorefractive properties a crystal has.

Table 2 below shows the result of measurements of gain coefficients $\Gamma$ by the laser beam coupling experiment described above. In this connection, examples 1 to 5 and comparative examples 1 to 3 exhibited hole-dominant photorefractive properties, whereas comparative example 4 showed an electron-dominant photorefractive properties.

TABLE 2

|  | Example | | | | | Comparative Example | | | |
|---|---|---|---|---|---|---|---|---|---|
|  | 1 | 2 | 3 | 4 | 5 | 1 | 2 | 3 | 4 |
| Gain Coefficient/(cm$^{-1}$) | 6.1 | 4.1 | 5.6 | 5.8 | 6.0 | 2.4 | 2.2 | 3.6 | 1.4 |

As shown in Table 2, the following facts were confirmed on the basis of the coupling experiment. From the comparison of example 1 with comparative example 2, the BaTiO3 single crystal prepared by the method of the present invention, that is, the crystal grown in the lower oxygen partial pressure exhibits greater photorefractive properties than the BaTiO3 single crystal grown in the air by conventional techniques. From the comparison of example 4 with comparative example 4, when the oxygen partial pressure in the heating step after the growing step is 0.1 atm. or more, the hole-dominant photorefractive properties increase. Furthermore, it can be said from the comparison of example 2 with comparative example 2, that the desirable photorefractive properties of the present invention are further enhanced if the amount of transition metal elements is not less than 2 ppm.

What is claimed is:

1. A process for preparing a single crystal of barium titanate comprising the steps of:
   a) melting a starting material mixture of titanium dioxide and an oxide or carbonate of barium to make a melt;
   b) growing a single crystal on the surface of a seed crystal of BaTiO3 by bringing said seed crystal into contact with said melt obtained in step a) in a closed atmosphere comprising an inert gas and oxygen and having an oxygen partial pressure of 0.02 atm. or less; and
   c) heating the single crystal obtained in step b) in a closed atmosphere comprising an inert gas and oxygen and having a higher oxygen partial pressure than that in step b).

2. A process for preparing a single crystal of barium titanate according to claim 1, wherein step a) is conducted in the presence of one or more transition metal elements selected from the group consisting of V, Cr, Mn, Fe, Co, Ni and Cu to achieve an amount of 2 ppm or more of the transition metal elements in the melt.

3. A process for preparing a single crystal of barium titanate according to claim 1, further comprising adding one or more transition metal elements selected from the group consisting of V, Cr, Mn, Fe, Co, Ni and Cu to the melt obtained in step a) to achieve an amount of 2 ppm or more of the transition metal elements in the melt.

4. A process for preparing a single crystal of barium titanate according to claim 1, wherein the oxygen partial pressure in step c) is 0.1 atm. or more.

5. A process for preparing a single crystal of barium titanate according to claim 4, wherein a heating temperature in said heating step is 600° C. or more.

6. A process for preparing a single crystal of barium titanate according to claim 1, wherein step a) is conducted at a temperature of at least 1330° C.

7. A process for preparing a single crystal of barium titanate according to claim 6, wherein step a) is conducted at a temperature in a range of from 1330° to 1600° C.

8. A process for preparing a single crystal of barium titanate according to claim 6, wherein step a) is conducted at a temperature in a range of from 1330° to 1460° C.

* * * * *